Figure 1:
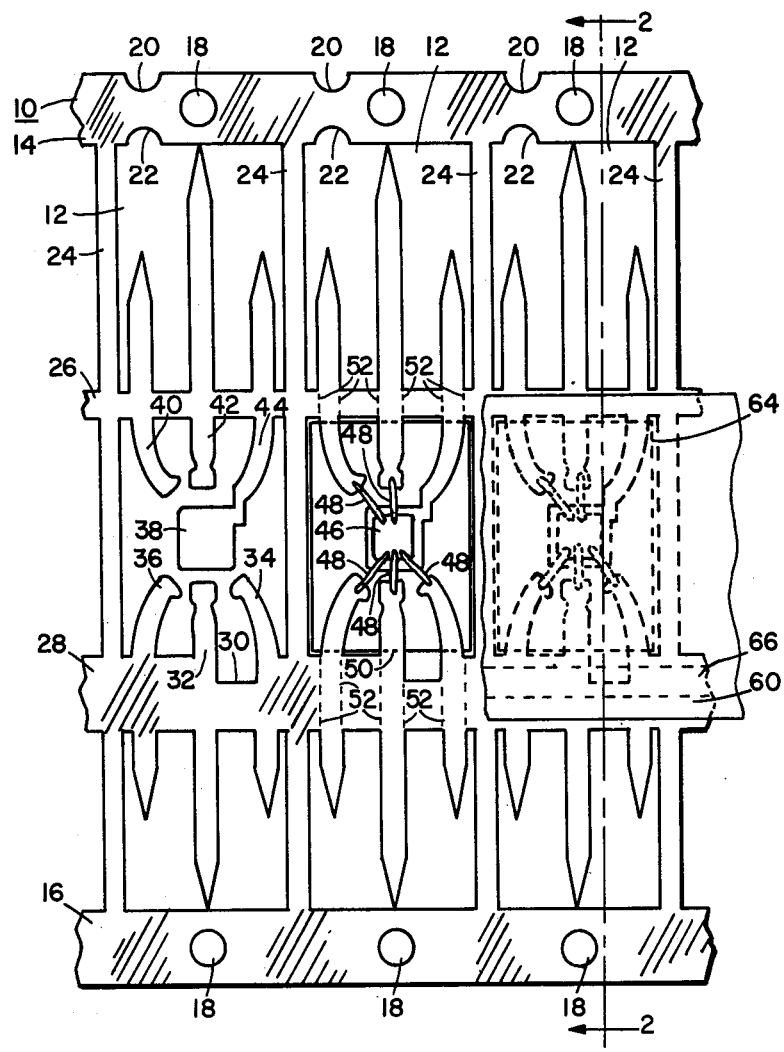

United States Patent [19]

Bliven et al.

[11] 3,950,140

[45] Apr. 13, 1976

[54] COMBINATION STRIP FRAME FOR SEMICONDUCTIVE DEVICE AND GATE FOR MOLDING

[75] Inventors: Thomas G. Bliven, Scottsdale; John R. Hugill, Phoenix, both of Ariz.

[73] Assignee: Motorola, Inc., Phoenix, Ariz.

[22] Filed: Feb. 18, 1975

[21] Appl. No.: 550,436

Related U.S. Application Data

[60] Continuation of Ser. No. 369,095, June 11, 1973, abandoned, which is a division of Ser. No. 79,601, Oct. 9, 1970, Pat. No. 3,753,634.

[52] U.S. Cl............................. 29/193.5; 174/52 PE
[51] Int. Cl.² ......................................... B32B 15/00
[58] Field of Search................ 29/193.5; 174/52 PE

[56] References Cited
UNITED STATES PATENTS

| | | | |
|---|---|---|---|
| 3,494,022 | 2/1970 | Maute | 29/588 |
| 3,611,061 | 10/1971 | Segerson | 29/589 |

*Primary Examiner*—L. Dewayne Rutledge
*Assistant Examiner*—Arthur J. Steiner

[57] ABSTRACT

In the step of plastic encapsulation of a semiconductive device, the inner ends of a group of leads comprising part of a lead frame, the semiconductive chip and the connections between the chip and the inner ends of the leads, are put into a cavity of a mold and fluid encapsulating material is forced into the cavity to surround the elements that are in the cavity with encapsulating material. A lead frame, which may be supplied in strip form, is provided, a part of which is so formed as to act as a gate for the admission of fluid encapsulating material into the mold cavity.

8 Claims, 3 Drawing Figures

U.S. Patent   April 13, 1976   3,950,140

COMBINATION STRIP FRAME FOR SEMICONDUCTIVE DEVICE AND GATE FOR MOLDING

This is a continuation of Ser. No. 369,095, filed June 11, 1973, now abandoned, which in turn is a division of Ser. No. 79,601, filed Oct. 9, 1970 now U.S. Pat. No. 3,753,634.

RELATED INVENTIONS

The invention of the present application is related to those in the following patents assigned to applicants' assignee; U.S. Pat. No. 3,444,441, issued May 13, 1969; U.S. Pat. No. 3,413,713, issued Dec. 3, 1968; and U.S. Pat. No. 3,539,675, issued Nov. 10, 1970.

BACKGROUND

It is known to provide lead frames in strip form and to connect bonding pads on a chip on which a circuit has been deposited to inner ends of corresponding leads of the lead frame, and then to place the chip, the inner ends of the lead frame and the connections thereto into the molding cavity and to force fluid encapsulating material into the mold cavity, thereby filling the cavity and encapsulating the chip, the inner ends of the lead frame and the connections thereto. In doing this in accordance with the prior art, a gateway in the mold is provided for the cavity for the entry thereinto of fluid encapsulating material and the gateway is connected by a feed runner to a main runner. The main runner is connected to a reservoir into which the encapsulating material is placed and liquified by applying heat thereto and a piston is forced into the reservoir to force the fluid through the main runner, through the feed runners and through the gates into the several cavities formed in the mold. The provision of the feed runners and gates complicates the construction and maintenance of the mold. Furthermore, in the prior art the main runner runs alongside the strip frame and to one side thereof whereby the feed runners are quite long since each thereof runs about half-way across the lead frame from the main runner to the cavities. Each time a mold is used, the cavities thereof and the main and feed runners must be cleaned out, since a clogged runner will prevent the cavity from being filled with encapsulating fluid, resulting in a reduced yield of properly encapsulated semiconductor devices.

It is an object of this invention to provide a lead frame, which may be provided in the form of a strip of lead frames, which do not require feed runners or gates in the mold when the inner ends of the lead frames are encapsulated as part of an encapsulated semiconductor device.

It is another object of this invention to provide the combination of a lead strip and a mold requiring no feeder runners or gates in the mold.

SUMMARY

A lead frame is provided which is cut, stamped, etched or formed in any manner out of conductive material in which at least one of the support bars, which are integral with the leads near the inner ends thereof, is made relatively wide so that it can act as at least a portion of the floor of a main runner for encapsulating material. The wide support bar is so notched or formed along the length thereof so that the main leader communicates with the space around the chip and its connections that will be filled with encapsulating material whereby no feeder runner or gate is required.

DESCRIPTION

Figure 2:
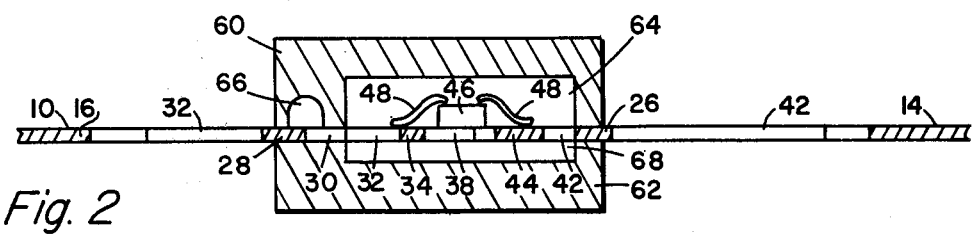
Figure 3:
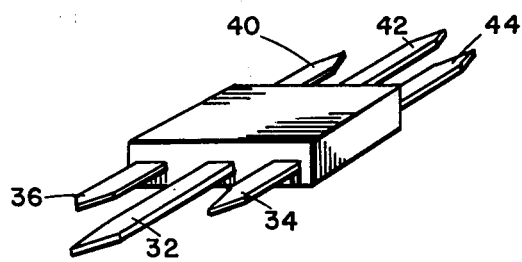

The invention will be better understood upon reading the following description in connection with the accompanying drawing in which FIG. 1 illustrates the lead frame and the mold of this invention in their cooperative position, FIG. 2 is a view of the device of FIG. 1 taken on the line 2 — 2 thereof, and FIG. 3 shows a completed encapsulated device made by use of the lead frame and mold of FIGS. 1 and 2.

A strip 10 of lead frames 12 is provided. While only three lead frames 12 are shown in strip form, there may be as many lead frames 12 as desired in the strip 10. The strip 10 may be made of any suitable conductive material, such as mild steel which is gold plated. While a frame having six leads, three of which come in in opposite directions from the other three, will be described, the frame may be provided with any number of leads and in whatever arrangement thereof that is convenient.

The strip 10 comprises two end bars 14 and 16 having indexing holes 18 along the length thereof. The end bar 14 may also be formed with external segmental notches 20 and internal segmental notches 22, which may also be used for indexing. Crossbars 24 are provided which run parallel to each other and perpendicularly to the end bars 14 and 16 and which include a lead frame 12 between them. The crossbars 24 are so spaced that their facing edges are separated by one dimension, the width dimension for example of the completed encapsulated semiconductor device of FIG. 3, as will be further explained. Each lead frame 12 includes two support bars 26 and 28. The bar 26 may be narrow and uniform in width and extend along the length of the strip 10, being integrally connected to the crossbars 24. The support bar 28 is quite wide and it also extends along the length of the strip 10 and is integral with the crossbars 24. The facing edges of the support bars 26 and 28 are separated by another dimension, the length dimension, for example, of the encapsulated semiconductor device of FIG. 3. However, the support bar 28 is not uniform in width in that a notch 30 is formed in the bar 26 along the length thereof between two crossbars 24 and facing the other support bar 26. As shown, the notch 30 is between the inner ends of the two leads 32 and 34 that extend towards the crossbar 26 from the crossbar 28. Also as shown, the inner end of another lead 36 also extends from the crossbar 28 towards the crossbar 26. The lead end 32 extends nearly perpendicular to the bar 28 and the lead ends 34 and 36 curve towards each other so that the ends of the leads 32, 34 and 36, which may be shaped in any convenient shape, are near a chip support pad 38. In many types of lead frames, no chip support pad need be provided. It will be understood that the notch 30 can take any shape or dimension or position as long as it performs its function of acting as a molding gate, as will be further explained, and as many notches 30 as is desirable may be used.

The ends of three other leads, 40, 42 and 44, extend from the inside edge of the support bar 26 towards the support bar 28. The lead 42 extends perpendicularly to the bar 26 while the leads 40 and 44 curve towards each other. The end of the lead 44 comprises the pad 38 for supporting the chip 46 of the semiconductor device. The ends of the leads 32, 34, 36, 40 and 42 are connected by connecting wires 48 to bonding pads on the chip 46. The chip itself is bonded to the support 38 whereby the lead 44 is connected to the chip 46. The inner part of the leads 32, 34, 36, 40, 42 and 44, the pad 38, the chip 46 and the connections 48, are all to be encapsulated by encapsulating material whose outline takes the shape of the rectangle 50 and whose shape may be seen in FIG. 3. Then, after encapsulation, the support bars 26 and 28 are cut along the edges of the leads 32, 34, 36, 40, 42 and 44 as for example on the dotted lines 52. In the molding step, the notch 30 acts as a gate for the entry of the encapsulating fluid into the mold cavity that contains the inner ends of the leads 32, 34, 36, 40, 42 and 44, the chip 46 and the corresponding connections 48, the support bar 28 acting as at least a portion of one wall of the main leader as is explained hereinafter.

The mold itself, see FIGS. 1 and 2, comprises an upper mold portion 60 and a lower mold portion 62. The upper mold portion runs lengthwise of the strip 10 and has as many cavities 64 and 68 as are convenient, one for each lead frame 12, the cavities 64 being large enough to include the chip 46, the connections 48 and the inner ends of the leads 32, 34, 36, 40, 42 and 44 up to the support strips 26 and 28 in one direction and up to the adjacent crossbars 24 in the other direction. The upper mold also includes a main runner 66 which runs the length thereof. The main runner 66 is so positioned with respect to the bar 28 that the bar 28 closes off at least a portion of the bottom of the runner 66 and the notches 30 act as gates for the several cavities 64 whereby encapsulating fluid forced down the runner 66 gets into the cavities 64 and 68 by way of the notches 30. The bottom part of the mold 62 has a cooperating cavity 68 that registers with the cavity 64. Due to the contacting of the mold portions 60 and 62 on the upper and lower surfaces of the bars 24, 26 and 24 and 28, the encapsulating fluid is retained therebetween. After the fluid has hardened in the closed mold, the mold portions 60 and 62 are removed, the end bars 14 and 16 are cut away. The bars 26 and 28 are cut through between the several leads as on the lines 52 and the completed encapsulated semiconductor device of FIG. 3 results. The scale of the drawing is very large. Actually, the distance between the extreme ends of the leads 32 and 34 may be about an inch, in one practical semiconductor device, and the other dimensions may be proportional thereto.

It is clear that two or more notches such as notch 30 may be formed along the length of the bar 28 and between the leads 32, 34 and 36 or between the leads 34 and 36 and the adjacent crossbar 24. Or, if no leads extend into the space between the bars 28 and 26 from the bar 28, the notch 30 may be made any size up to the width of the completed device of FIG. 3, that is, the notch may extend any part or all of the distance between the adjacent crossbars 26.

The above description is of one embodiment of this invention and this invention is not to be limited by the shape of the lead frame or of the chip or of the connection of the chip to the conductors comprising the lead frame but is limited only by the appended claims.

What is claimed is:

1. In an integral metal strip to serve the purpose of a carrier for electric components assembled thereon to be encapsulated in a multi-portion plastic mold having a plurality of cavities and a runner therein, and to serve the purpose of gate means for such plastic mold runner in a molding operation, such metal strip having a plurality of frame portions disposed side by side over the length of said metal strip, each frame portion having a mount for an electrical component and two groups of conductors extending away from said mount which are electrically connectible with an electric component when secured on said mount, with one group of said conductors extending in one direction away from said mount and the other group extending in the opposite direction from said mount in such frame portion, and two support bars each extending the length of said metal strip and spaced apart from one another on opposite sides of said frame portion mounts with one support bar being integral with one group of conductors in each frame portion in the metal strip and the other support bar being integral with the other group of conductors in each frame portion in the strip, the improvement being that one of said support bars is wider than the other and is positionable over the runner in the plastic mold, said wider support bar having therein at least one notch for each frame portion with said notch opening toward said mount in that frame portion and toward a mold cavity and opening into the mold runner whereby plastic flowing in the mold runner flows through said wider support bar notch as a gate for a corresponding mold cavity to plastic encapsulate the electrical component and mount in such a cavity.

2. In an integral metal strip as defined in claim 1, a plurality of lateral bars therein, with two of said lateral bars spaced apart and defining the width of a frame portion longitudinally of the metal strip, said two lateral bars and said two support bars for a frame portion defining a generally open central area of a frame portion into which plastic will flow from a mold runner through the notch gate for that frame portion into the corresponding mold cavity.

3. In an integral metal strip as defined in claim 1 wherein the area of each notch in said wider support bar and the thickness thereof comprise the area and height dimensions of that gate for plastic flow in the mold.

4. In an integral metal strip as defined in claim 1, wherein said notches in the wider support bar for the plurality of frame portions together serve as the sole gates for plastic flow from a mold runner into mold cavities to plastic encapsulate corresponding mounts and assembled electric components.

5. In an integral metal strip as defined in claim 1 wherein the said notch in a frame portion is provided in said wider support bar between two conductors integral with said wider support bar in that frame portion.

6. In an integral metal strip as defined in claim 2 wherein the dimension of each said notch longitudinally in said wider support bar is substantially that of the dimension between said two conductors.

7. In an integral metal strip as defined in claim 1 wherein said conductors in a group in a frame portion are not all of the same length.

8. In an integral metal strip to serve the purposes as defined in claim 1 with the multi-portion plastic mold, such mold having a plurality of cavities corresponding to the number of frame portions in such metal strip, and said runner in such mold extending longitudinally of such metal strip adjacent said mold cavities but not connected in said mold with said cavities, wherein said wider support bar when positioned over said runner has said notches therein serving as the sole gates for plastic flow from the runner into a mold cavity corresponding to a notch.

\* \* \* \* \*